United States Patent
Costa et al.

(10) Patent No.: US 10,439,564 B1
(45) Date of Patent: Oct. 8, 2019

(54) SECOND HARMONIC TERMINATIONS FOR AM-AM AND AM-PM SUPPRESSION

(71) Applicant: pSemi Corporation, San Diego, CA (US)

(72) Inventors: Damian Costa, San Diego, CA (US); Chih-Chieh Cheng, Poway, CA (US); Richard B. Whatley, Carlsbad, CA (US); Tero Tapio Ranta, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 49 days.

(21) Appl. No.: 15/942,328

(22) Filed: Mar. 30, 2018

(51) Int. Cl.
| | | |
|---|---|---|
| *H03F 3/191* | (2006.01) | |
| *H03F 1/32* | (2006.01) | |
| *H03F 3/195* | (2006.01) | |
| *H03F 3/21* | (2006.01) | |

(52) U.S. Cl.
CPC .......... *H03F 1/3205* (2013.01); *H03F 3/195* (2013.01); *H03F 3/211* (2013.01); *H03F 2200/222* (2013.01); *H03F 2200/267* (2013.01); *H03F 2200/387* (2013.01); *H03F 2200/451* (2013.01); *H03F 2201/3215* (2013.01); *H03F 2203/21103* (2013.01); *H03F 2203/21139* (2013.01)

(58) Field of Classification Search
CPC ................................ H03F 3/191; H03F 3/193
USPC ......................................... 330/302, 305, 306
See application file for complete search history.

(56) References Cited

U.S. PATENT DOCUMENTS

| | | | | |
|---|---|---|---|---|
| 5,095,285 | A * | 3/1992 | Khatibzadeh | H03F 1/32 330/306 |
| 5,347,229 | A * | 9/1994 | Suckling | H03F 1/32 330/251 |
| 6,236,274 | B1 * | 5/2001 | Liu | H03F 3/217 330/302 |
| 9,024,700 | B2 | 5/2015 | Ranta | |
| 9,294,056 | B2 | 3/2016 | Nobbe et al. | |
| 9,602,063 | B2 | 3/2017 | Kaatz et al. | |

OTHER PUBLICATIONS

Abbasian ., entitled "Effect of Second and Third Harmonic Input Impedances in a Class-F Amplifier", published in Progress in Electromagnetics Research C, vol. 56, pp. 39-53, 2015.

* cited by examiner

*Primary Examiner* — Steven J Mottola
(74) *Attorney, Agent, or Firm* — Jaquez Land Greenhaus LLP; Alessandro Steinfl, Esq.

(57) ABSTRACT

Methods and devices for improving AM-AM and AM-PM performance of an RF amplifier are presented. According to one aspect, input and output harmonic terminations coupled to the input and output of the amplifier are tuned at frequencies near to, but different than, a second harmonic frequency of an RF signal to be amplified. Improved AM-AM and AM-PM performance is obtained when i) the input harmonic termination is tuned at a frequency that is below the second harmonic frequency and the output harmonic termination is tuned at a frequency that is above the second harmonic frequency, and ii) the input harmonic termination is tuned at a frequency that is farther away from the second harmonic frequency than the frequency used for tuning of the output harmonic termination.

17 Claims, 13 Drawing Sheets

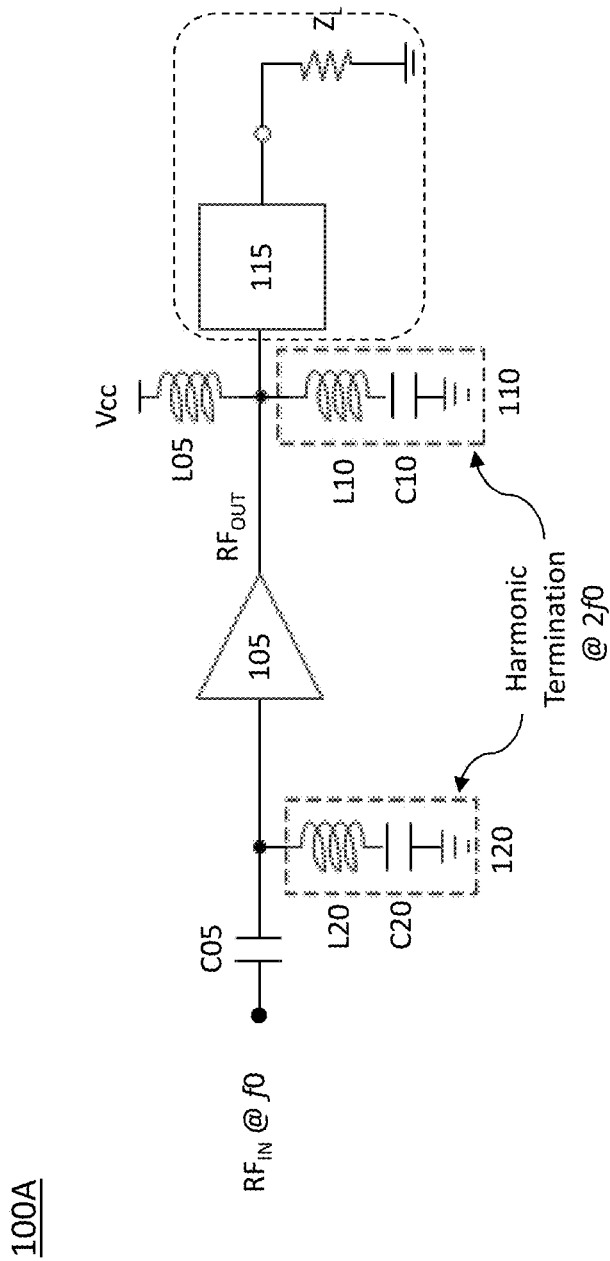
FIG. 1A  *Prior Art*

SECOND HARMONIC TERMINATIONS FOR AM-AM AND AM-PM SUPPRESSION

CROSS-REFERENCE TO RELATED APPLICATIONS

The present application may be related to U.S. Pat. No. 9,602,063 B2, entitled "Variable Impedance Match and Variable Harmonic Terminations for Different Modes and Frequency Bands", issued Mar. 21, 2017, the disclosure of which is incorporated herein by reference in its entirety. The present application may also be related to a paper from Abbasian S. and Johnson T., entitled "Effect of Second and Third Harmonic Input Impedances in a Class-F Amplifier", published in *Progress in Electromagnetics Research C*, Vol. 56, pgs. 39-53, 2015, the disclosure of which is incorporated herein by reference in its entirety. The present application may also be related to U.S. Pat. No. 9,024,700 B2, entitled "Method and Apparatus for Use in Digitally Tuning a Capacitor in an Integrated Circuit Device", issued May 5, 2015, the disclosure of which is incorporated herein by reference in its entirety. The present application may also be related to U.S. Pat. No. 9,294,056 B2, entitled "Scalable Periphery Tunable Matching Power Amplifier", issued Mar. 22, 2016, the disclosure of which is incorporated herein by reference in its entirety.

TECHNICAL FIELD

The present application generally relates to electronic circuits, and more specifically to methods and devices for reducing distortion due to gain compression or expansion (i.e. AM-AM) and/or phase deviation (i.e., AM-PM) in amplifier circuits.

BACKGROUND

It is well known in the art that certain harmonic components based on a fundamental frequency (i.e., operating frequency) of a radio frequency (RF) signal fed to an amplifier circuit can degrade linearity and efficiency characteristics of the amplifier. Proper treatment of the harmonic components can shape the waveform of the RF signal (e.g., at an output of the amplifier), so to enhance efficiency and other performance parameters of the amplifier. Teachings according to the prior art address such degradation by attenuating of the harmonic components via harmonic terminations (e.g., harmonic impedances such as harmonic shorts or harmonic open) coupled to an input and/or output of the amplifier. In such teachings, harmonic terminations that are tuned at harmonic frequencies of the fundamental frequency are used to attenuate amplitude of the harmonic components so to reduce their impact on a signal amplified by the amplifier.

As described in the above referenced U.S. Pat. No. 9,602,063 B2, the disclosure of which is incorporated herein by reference in its entirety, a second harmonic (i.e., second order product) can mix with the fundamental to generate third-order intermodulation products close to the fundamental frequency, and thus affect linearity. Attenuation of the second harmonic, via for example, a second harmonic short tuned at the second harmonic frequency, can therefore improve linearity. Such reference applies harmonic terminations at the output of the amplifier to attenuate second order and higher harmonic components and therefore maintain a desired linearity performance of the amplifier.

As described in the above referenced paper from Abbasian et al., the disclosure of which is incorporated herein by reference in its entirety, harmonic components at the output of the amplifier may couple to the input of the amplifier via nonlinear couplings (e.g. nonlinear transconductance, nonlinear capacitance) inherent to the amplifier design, and thereby affect linearity and efficiency characteristics of the amplifier. Abbasian et al. address existence of such nonlinear couplings by placing, at the input of the amplifier, harmonic terminations tuned at the harmonic frequencies of the fundamental frequency so to reduce amplitude of the coupled harmonics components at the input.

It would be clear to a person skilled in the art that both above references seek to maintain linearity and efficiency characteristics of the amplifier while considering effects of an input signal to the amplifier having a dual tone or complex modulated waveform, determined via, for example, well-known in the art two-tone IMD measurement techniques. Such techniques use two single frequency signals (tones) at different frequencies as input to the amplifier, to characterize corresponding intermodulation products (i.e. harmonic components) generated at input and/or output of the amplifier (in response to the two tones) that are indicative of linear distortion. Such characterization can serve as basis for design of harmonic terminations tuned at the harmonic frequencies for reducing of the intermodulation products, thereby improving linearity.

However, current modulation schemes may include single tone RF signals, where a down converted harmonic component from the second harmonic to the fundamental frequency (i.e., frequency of the single tone) may affect amplitude and phase at the output of the amplifier. Such effect on the amplitude and phase at the output of the amplifier may be measured in terms of well-known in the art metrics such as AM-AM distortion and AM-PM distortion. Attenuation of harmonic components via harmonic terminations tuned at harmonic frequencies of the fundamental frequency, as taught by the above discussed references, may not be sufficient in providing an increased performance in terms of such metrics for a case of a single tone RF signal. Teachings according to the present disclosure are aimed to reduce AM-AM distortion and AM-PM distortion while, in some cases, sacrificing a performance in the attenuation of the harmonic components.

SUMMARY

The details of one or more embodiments according to the present disclosure are set forth in the accompanying drawings and the description below. Other features, objects, and advantages of such embodiments will be apparent from the description and drawings, and from the claims.

According to a first aspect of the present disclosure, a radio frequency (RF) amplification circuit is presented, the RF amplification circuit comprising: an amplifier configured to amplify an RF signal having an operating frequency $f_O$; an input harmonic termination coupled to an input of the amplifier; and an output harmonic termination coupled to an output of the amplifier, wherein the input harmonic termination has a resonant frequency $f_{IN}$ that is near to, but smaller than, the second harmonic frequency $2f_O$ of the operating frequency, and wherein the output harmonic termination has a resonant frequency $f_{OUT}$ that is near to, but greater than, the second harmonic $2f_O$ frequency of the operating frequency.

According to a second aspect of the present disclosure, a method for improving AM-AM and AM-PM performance of an RF amplifier is presented, the method comprising: providing an amplifier configured to amplify an RF signal having an operating frequency $f_0$; coupling an input harmonic termination to an input of the amplifier; coupling an output harmonic termination to an output of the amplifier; and based on the coupling, improving AM-AM and AM-PM performance of the RF amplifier, wherein the input harmonic termination has a resonant frequency $f_{IN}$ that is near to, but smaller than, the second harmonic frequency $2f_0$ of the operating frequency, and wherein the output harmonic termination has a resonant frequency $f_{OUT}$ that is near to, but greater than, the second harmonic frequency $2f_0$ of the operating frequency.

DESCRIPTION OF THE DRAWINGS

The accompanying drawings, which are incorporated into and constitute a part of this specification, illustrate one or more embodiments of the present disclosure and, together with the description of example embodiments, serve to explain the principles and implementations of the disclosure.

FIG. 1A shows a schematic diagram of a prior art radio frequency (RF) amplification stage, comprising a harmonic termination at an input of an amplifier of the amplification stage, and/or a harmonic termination at an output of the amplifier, wherein the harmonic terminations are tuned at a frequency that is twice the fundamental frequency of an input RF signal to the amplifier.

Like reference numbers and designations in the various drawings indicate like elements.

DETAILED DESCRIPTION

Figure 1B:
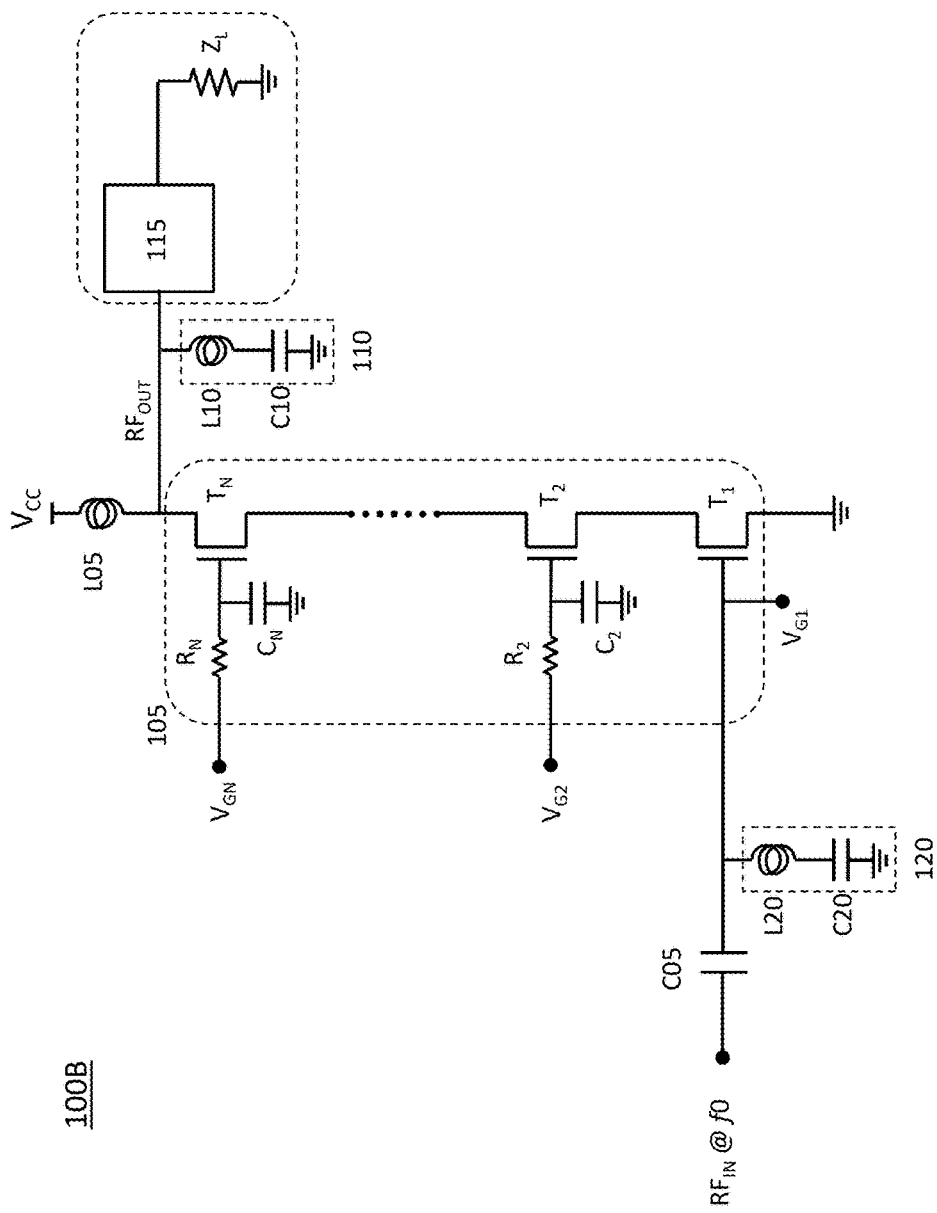
FIG. 1B shows a schematic diagram of the prior art RF amplification stage of FIG. 1A, wherein the amplifier is a MOS amplifier comprising stacked FET transistors.

As used herein, the term "operating frequency" can refer to a frequency of a signal being input to a device (such as an amplifier). As used herein, the term "fundamental frequency" and the term "operating frequency" are synonymous and may be used interchangeably. As used herein, the term "fundamental" can refer to a primary signal component at the operating frequency of the device. As used herein, the term "harmonic" can refer to a signal component at a frequency equal to n times the operating frequency, where n can be any integer greater than or equal to 2.

FIG. 1A shows a schematic diagram of a prior art radio frequency (RF) amplification stage (100A), comprising a harmonic termination (120) at an input of an amplifier (105) of the amplification stage (100A), and/or a harmonic termination (110) at an output of the amplifier (105), wherein the harmonic terminations (110, 120) are tuned at a frequency that is twice an operating frequency, $f_0$, of an input RF signal, $RF_{IN}$, to the amplifier (105). In other words, the harmonic terminations (110, 120) have a resonant frequency, $f_r$, that is equal to, or substantially equal to, twice the operating frequency of the input RF signal. At the resonant frequency, the harmonic terminations (110, 120), which may comprise an inductor (L10, L20) coupled to a capacitor (C10, C20), may present a very low impedance to an RF signal and therefore attenuate second harmonic signals to the RF signal. It should be noted that as used herein, the term "harmonic termination" or "harmonic impedance" may refer to a termination network or an impedance network, comprising a combination of series and/or parallel reactive components, that are tuned at a frequency that is close to, but not necessarily equal to or substantially equal to, a harmonic frequency (i.e., integer multiples) of the operating frequency of the input RF signal. Accordingly, in the present disclosure, such terms shall be used in conjunction with an associated resonant (i.e. tuning) frequency, such as, for example, "a harmonic termination tuned at a frequency $f_r$,", where $f_r$ is related to the operating frequency of the RF signal and can take a value of equal to, or different but close to, a harmonic of the operating frequency.

As can be seen in FIG. 1A, a DC coupling capacitor C05 may be used to couple the input RF signal, $RF_{IN}$, to the input of the amplifier (105), and an inductor L05 may be used to couple a supply voltage, Vcc (e.g., battery, voltage regulator, DC/DC converter, or other), to the output of the amplifier (105). Furthermore, a load, $Z_L$, may be coupled to the output of the amplifier (105) through a match circuit (115). The match circuit (115) may be provided to reduce loss due to an impedance mismatch between the load, $Z_L$, and an output impedance of the amplifier (105) that includes the harmonic termination (110). Dotted box surrounding the match circuit (115) and the load $Z_L$ in FIG. 1A (as well as later figures) indicate optional elements outside the main scope of the present application. A person skilled in the art is well aware of use of, and design techniques for, such match circuit (115), which are beyond the scope of the present disclosure. Design and implementation examples of such match circuits, as well as the harmonic terminations (110, 120), are described, for example, in the above referenced papers, the disclosures of which are incorporated herein by reference in their entirety.

Figure 11:
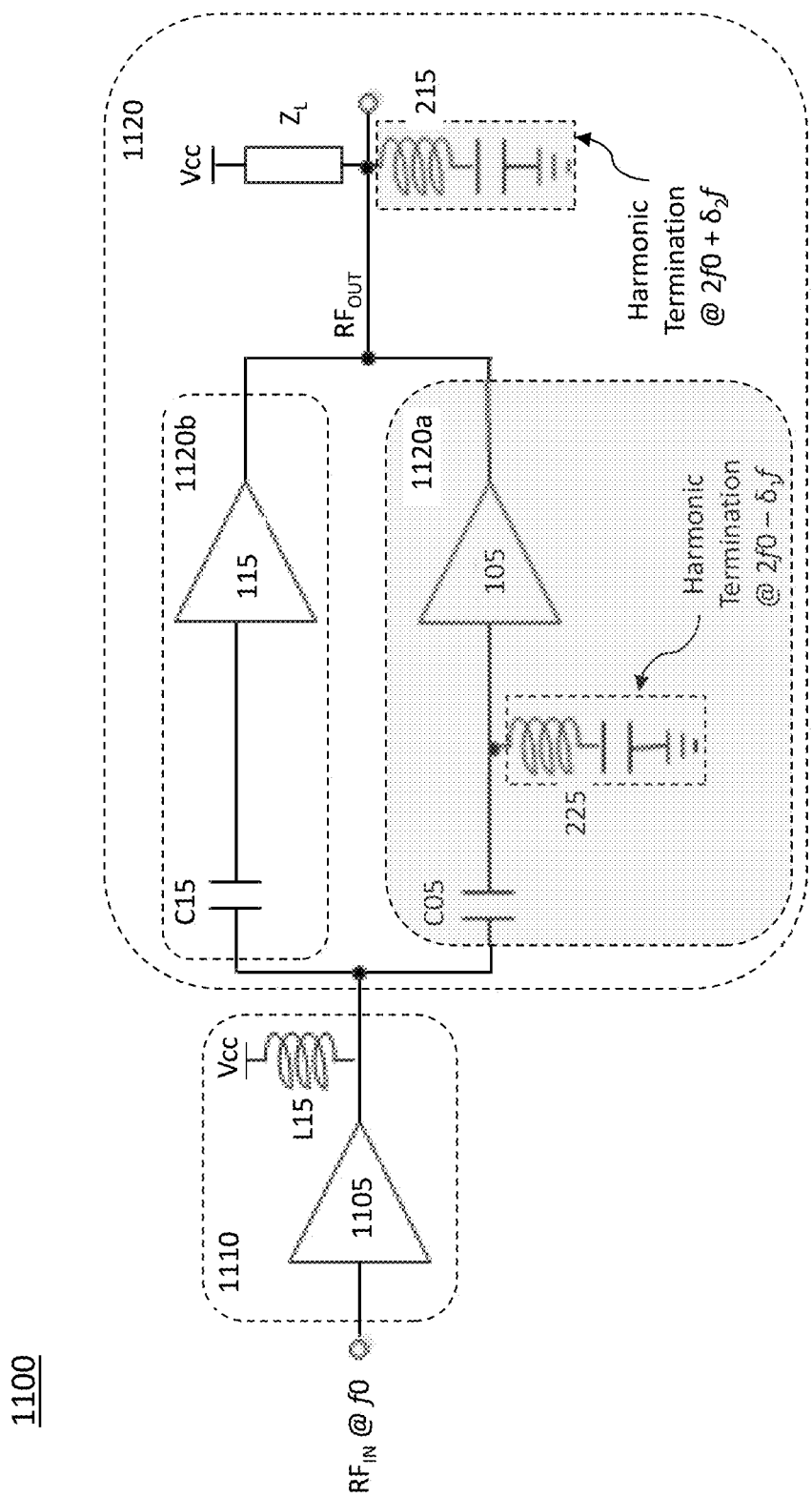
FIG. 11 shows a schematic diagram of an amplification chain comprising parallel amplification stages and series amplification stages comprising the amplification stage according to the disclosure of FIG. 3.

With further reference to FIG. 1A, a person skilled in the art would realize that the amplification stage (105) may be part of a larger amplification chain that may include several cascaded (e.g., series connected) and/or parallel amplification stages, each having components similar to the components of the amplification stage (100A). An exemplary configuration of such larger amplification chain is shown in FIG. 11 later described.

The amplifier (105) may be any amplifier known to a person skilled in the art and adapted to process RF signals with frequency content according to, for example, current air standards and corresponding modulation schemes. Such amplifiers may include bipolar amplifiers and CMOS amplifiers as known to a person skilled in the art. FIG. 1B shows an exemplary configuration of the amplification stage of FIG. 1A where the amplifier (105) is a CMOS amplifier comprising stacked FETs (T1, T2, . . . , TN) operating as a cascode arrangement. The FET T1 is an input FET to the amplifier (105), FETs (T2, . . . , TN) are cascode FETs of the amplifier (105), and FET TN is an output FET of the amplifier (105). Biasing to the cascode FETs (T2, . . . , TN) can be provided by respective biasing voltages (VG2, . . . , VGN) coupled to respective gates of the cascode FETs (T2, . . . , TN) through respective series connected gate resistors (R2, . . . , RN) and shunted gate capacitors (C2, . . . , CN). Such biasing of the stack (T1, . . . , TN), combined with gate capacitors to adjust the RF voltage division, can allow for a desired distribution of the RF voltage of the $RF_{OUT}$ signal at the output of the amplifier across the transistors (T1, T2, . . . , TN) of the stack. Such distribution is possible due to the gate capacitors (C2, . . . , CN) which are sized to allow the respective gate nodes of the cascode transistors (T2, . . . , TN) to float at controlled amounts such that the RF voltage is divided across the stack of devices.

According to the above discussed referenced papers, the disclosures of which are incorporated herein by reference in their entirety, the prior art amplification stage (100A) may use one or both of the harmonic terminations (110, 120) tuned at the second harmonic of the operating frequency of the input RF signal, $RF_{IN}$. Although such tuning of the harmonic termination (110, 120) according to the prior art may be effective in attenuating harmonic components at one or more of the input and the output of the amplifier (105) for a reduced intermodulation distortion, applicant of the present disclosure has found, through simulation of models and experimentation of actual circuits, that such tuning may not be effective in reducing AM-AM (amplitude-amplitude) and AM-PM (amplitude-phase) distortion at the output of the amplifier (105). It follows that, as described below with reference to the amplification stage (200) shown in FIG. 2, and graphs shown in FIGS. 3-10B, tuning according to the present disclosure of the input and output harmonic terminations to frequencies different from two times the operating frequency of the input RF signal, $RF_{IN}$, can further reduce AM-AM and AM-PM distortion albeit with a lesser attenuation of the harmonic components.

As will be described below with reference to FIG. 2, the tuning according to the present disclosure tunes the input harmonic termination (225) to a frequency equal to $2f_0-\delta_1 f$, and tunes the output harmonic termination (215) to a frequency equal to $2f_0+\delta_2 f$, where $\delta_1 f > \delta_2 f$. In other words, the two harmonic terminations (215, 225) are tuned asymmetrically with respect to the second harmonic frequency, $2f_0$, of the operating frequency, $f_0$, of the input RF signal, $RF_{IN}$, with the output harmonic termination (215) tuned at a frequency (i.e. resonant frequency), $2f_0+\delta_2 f$, that is closer to the second harmonic frequency, $2f_0$, when compared to the resonant frequency, $2f_0-\delta_1 f$, of the input harmonic termination (225), as shown in FIG. 3 later described. Furthermore, as described below, such asymmetrical tuning, according to the present disclosure, with respect to the second harmonic frequency, $2f_0$, of the operating frequency, $f_0$, of the input RF signal, $RF_{IN}$, is not inversible. Applicant of the present disclosure has found that tuning the input/output harmonic terminations asymmetrically with $\delta_2 f > \delta_1 f$ would not yield in the reduction of the AM-AM and AM-PM distortion when compared to the prior art configuration.

Figure 2:
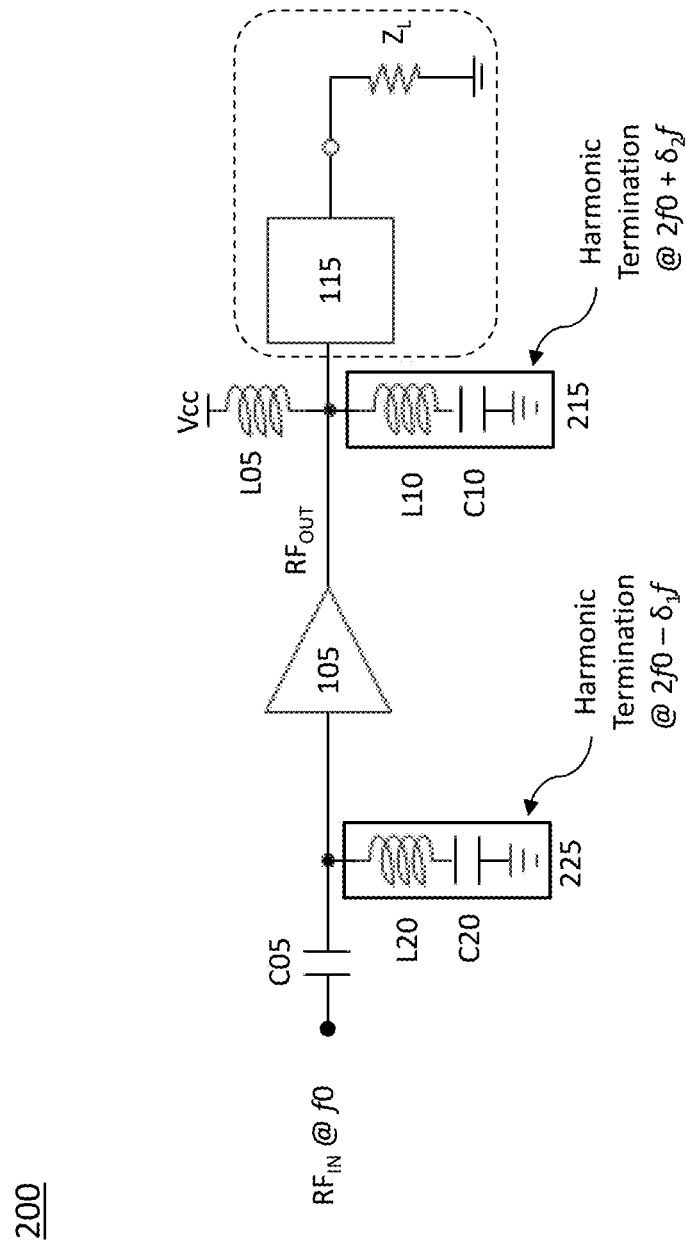
FIG. 2 shows a schematic diagram of an RF amplification stage according to an embodiment of the present disclosure, comprising an input harmonic termination at an input of an amplifier of the amplification stage, and an output harmonic termination at an output of the amplifier, wherein the input harmonic termination is tuned at a frequency that is smaller than twice a fundamental frequency of an input RF signal to the amplifier, and the output harmonic termination is tuned at a frequency that is greater than twice the fundamental frequency of the input RF signal to the amplifier.
Figure 3:
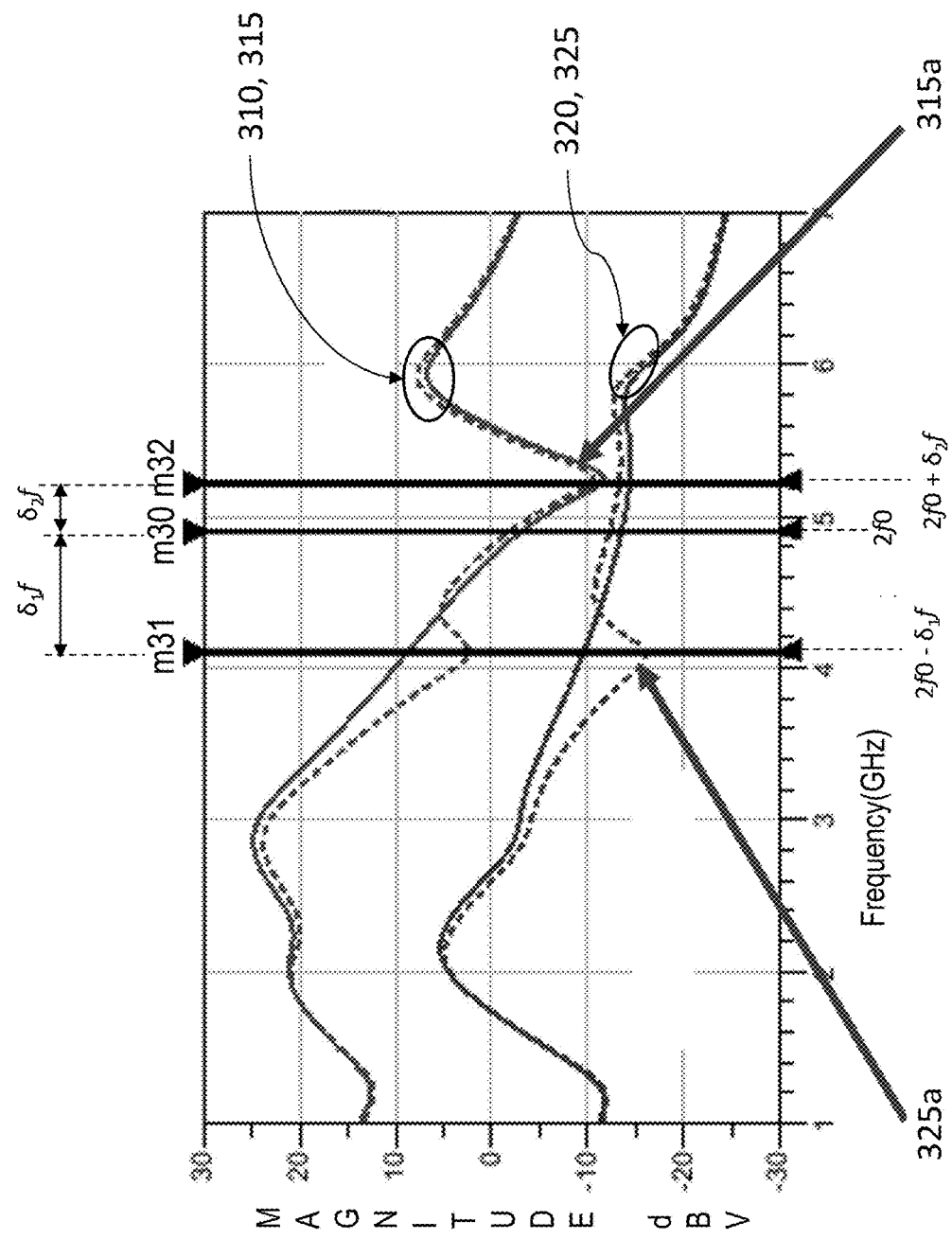
FIG. 3 shows graphs representing magnitude, as a function of frequency, of an RF signal at the input and the output of the amplifier of FIG. 2, contrasted to a case where the input harmonic termination of FIG. 2 is not used.

FIG. 2 shows a schematic diagram of an RF amplification stage (200) according to an embodiment of the present disclosure, comprising an input harmonic termination (225) at an input of an amplifier (105) of the amplification stage (200), and an output harmonic termination (215) at an output of the amplifier (105). A person skilled in the art would realize that the amplification stage (200) is similar in structure/components to the amplification stage (100A) discussed above with respect to FIG. 1A, except for the tuning of the harmonic terminations. The input harmonic termination (225) is tuned at a frequency, $2f_0-\delta_1 f$, (i.e., resonant frequency=$2f_0-\delta_1 f$) that is smaller (i.e., by the value $\delta_1 f$) than twice the operating frequency, $f_0$, of an input RF signal, $RF_{IN}$, to the amplifier (105), and the output harmonic termination (215) is tuned at a frequency, $2f_0+\delta_2 f$, that is greater (i.e., by the value $\delta_2 f$) than twice the operating frequency, $f_0$, of the input RF signal, $RF_{IN}$, to the amplifier. As described above, the resonant frequencies of the input/output harmonic terminations (215, 225) are placed asymmetrically with respect to the operating frequency, $f_0$, of the input RF signal, $RF_{IN}$, where $\delta_1 f > \delta_2 f$.

Applicant of the present disclosure has found, through simulation and experimental approaches, that reduced AM-AM distortion and AM-PM distortion performance of the amplification stage (200A) of FIG. 2, as compared to the amplification stage (100A) of FIG. 1A, may be obtained by choosing, according to an embodiment of the present disclosure, $\delta_1 f$ from a range of 10% to 20% of $2f_0$ and $\delta_2 f$ from a range of 5% to 10% of $2f_0$. According to a preferred embodiment of the present disclosure, $\delta_1 f$ may be chosen from a range of 15% to 18% of $2f_0$ and $\delta_2 f$ from a range of 5% to 8% of $2f_0$. Applicant of the present disclosure has found that ranges of $\delta_1 f$ and $\delta_2 f$ may be further adjusted based on a frequency bandwidth of the input RF signal, $RF_{IN}$.

With continued reference to FIG. 2, it should be noted that values of $\delta_1 f$ and $\delta_2 f$ are controlled design parameters according to the teachings of the present disclosure, and their effect on the resonance frequencies of the corresponding input/output harmonic terminations (225, 215) is therefore deterministic per design and different from variations of the resonance frequencies obtained from, for example, process/manufacturing/component aging variations or other as known to a person skilled in the art. In other words, harmonic terminations, such as (110, 120) of FIG. 1A, that are tuned, per design, at the second harmonic, $2f_0$, of the operating frequency, $f_0$, cannot be likened to the input/output harmonic termination (215, 225) of the present teachings based on variations of the tuned frequencies as a consequence of process/manufacturing/component aging variations or other not part of the intended design.

FIG. 3 shows graphs representing magnitude, as a function of frequency, of an RF signal at the input and the output of the amplifier (105) of FIG. 2 where both the input and output harmonic terminations (225, 215) are present, contrasted to a case where the input harmonic termination of FIG. 2 is not present. Graphs (310, 320), shown with solid traces, respectively show magnitude, in dBV, at the output and input of the amplifier (105) shown in FIG. 2 without the input termination (225), while graphs (315, 325), shown with dotted traces, respectively show magnitude, in dBV, at the output and input of the amplifier (105) of the configuration according to the present teachings shown in FIG. 2 (i.e., both terminations 215, 225 present). Such graphs are used to show effect of the input harmonic termination on the configuration of FIG. 2. It should be noted that the graphs of FIG. 3, as well as other graphs later described, consider an input RF signal, $RF_{IN}$, to the amplifier (105), having an exemplary and non-limiting operating frequency, $f_0$, equal to 2.45 GHz, and therefore a second harmonic frequency, $2f_0$, equal to 4.90 GHz, as indicated by the marker m30 of FIG. 3. Markers m31 and m32 of FIG. 3 respectively indicate positions of the resonant frequencies $2f_0-\delta_1 f$ (e.g., 4.11 GHz) of the input harmonic termination (225), and $2f_0+\delta_2 f$ (e.g., 5.22 GHz) of the output harmonic termination (215).

As shown in the graphs (310, 315) of FIG. 3, magnitude of the RF signal at the input and output of the amplifier (105) is not affected near the second harmonic frequency $2f_0$ by the introduction of the input harmonic termination (225). In other words, intersection of marker m30 and graphs (320, 325), and marker m30 and graphs (310, 315), is at substantially the same locations. This allows, for example, setting a desired attenuation of the second harmonic component at the output of the amplifier (105) via the output harmonic termination (215) and independently of the input harmonic termination (225). Furthermore, as can be seen in FIG. 3, a magnitude value of the second harmonic component at the output of the amplifier (intersection of marker m30 and graphs (310, 315)) is not at a minimum value of the graphs, rather, the minimum value is at location (315a) corresponding to the intersection of marker m32 and graphs (310, 315). In other words, and in contrast to the prior art teachings, tuning of the output harmonic termination (215) of the present teachings does not attempt to minimize the second harmonic component at the output of the amplifier (105). Finally, as can be seen in the graphs of FIG. 3, addition of the input harmonic termination (225) can further attenuate the RF signal at frequencies close to the resonant frequency $2f_0-\delta_1 f$ of the input harmonic termination, characterized by, for example, a local minimum value (e.g., 325a) at the intersection of the marker m31 and graphs (315, 325), while minimally affecting the RF signal at the operating frequency of 2.45 GHz.

Figure 4B:
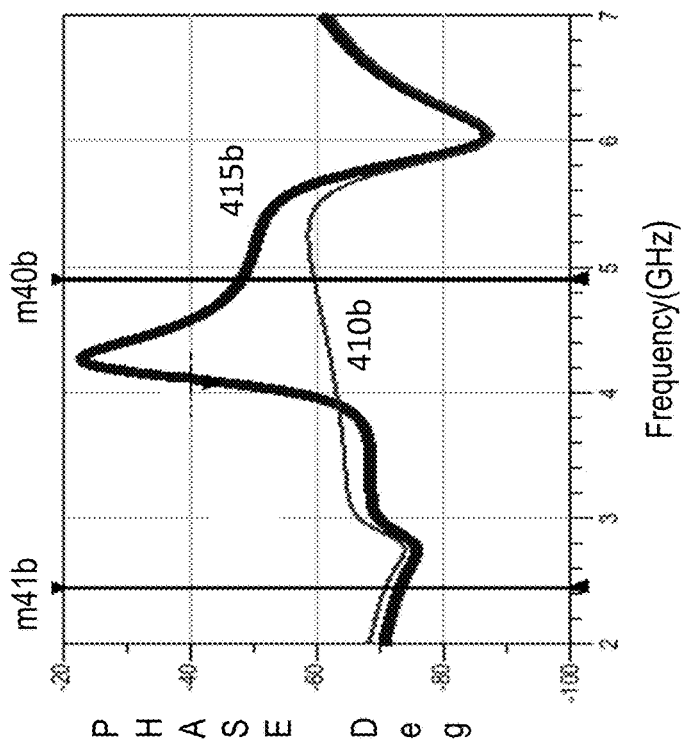
FIGS. 4A and 4B respectively show graphs representing a magnitude as a function of frequency, and a phase as a function of frequency, of an impedance looking into the input of the amplifier of FIG. 2, contrasted to a case where the input harmonic termination of FIG. 2 is not used.
Figure 4A:
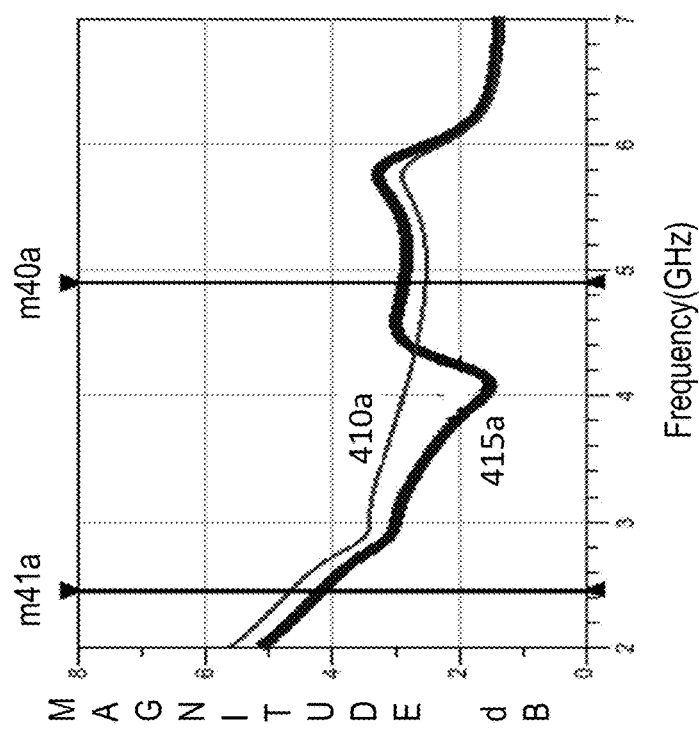

FIGS. 4A and 4B show graphs, (410a, 415a) and (410b, 415b), respectively representing a magnitude as a function of frequency, and a phase as a function of frequency, of an impedance looking into the input of the amplifier (105) of FIG. 2, contrasted to a case where the input harmonic termination (225) of FIG. 2 is not used. Bold graphs (415a, 415b) respectively show amplitude and phase as function of the frequency of the impedance looking into the amplifier (105) of FIG. 2 with both input and output harmonic terminations (215, 225) present, while graphs (410a, 410b) respectively show amplitude and phase as function of the frequency of the impedance looking into the amplifier (105) of FIG. 2 without the input harmonic termination (225). Markers (m40a, m40b) are set at the second harmonic frequency, $2f_0$, (e.g., 4.40 GHz), while markers (m41a, m41b) are set at the operating frequency, $f_0$, (e.g. 2.45 GHz).

As can be seen in FIG. 4A, addition of the input harmonic termination (225) at the resonant frequency, $2f_0-\delta_1 f$, that is sufficiently below the second harmonic frequency, $2f_0$, does not significantly change the magnitude of the impedance at the operating frequency, $f_0$, (marker m41a) or at the second harmonic frequency, $2f_0$, (marker m40a). However, as can be seen in FIG. 4B, phase of the impedance looking into the input of the amplifier (105) is significantly affected around the second harmonic frequency, $2f_0$, (marker 415b) by the addition of the input harmonic termination (225) while not significantly affected around the operating frequency $f_0$ (marker m41b). In particular, as can be seen in FIG. 4B, addition of the input harmonic termination (225) according to the present teachings, in combination with the output harmonic termination (215), creates a steeper and linear slope (e.g., in the form of $y=-ax+b$, x being frequency, a and b constants) of the phase around the second harmonic frequency $2f_0$. Applicant of the present disclosure has found that such slope of the impedance looking into the input of the amplifier (105) can allow a different pulling of the phase at $2f_0$ under input RF drive, and therefore affect AM-AM and AM-PM distortion differently. In other words, as the input RF amplitude (i.e., power) changes, the steeper linear slope of the input impedance phase at $2f_0$ allows for more change of an effective input impedance seen at the input of the amplifier (105), which therefore, as can be seen in the next graphs, can result in better AM-AM and AM-PM performance. As described earlier with reference to FIG. 3, such better performance in terms of AM-AM and AM-PM metrics is based on a trade-off with second harmonic rejection.

Figure 5:
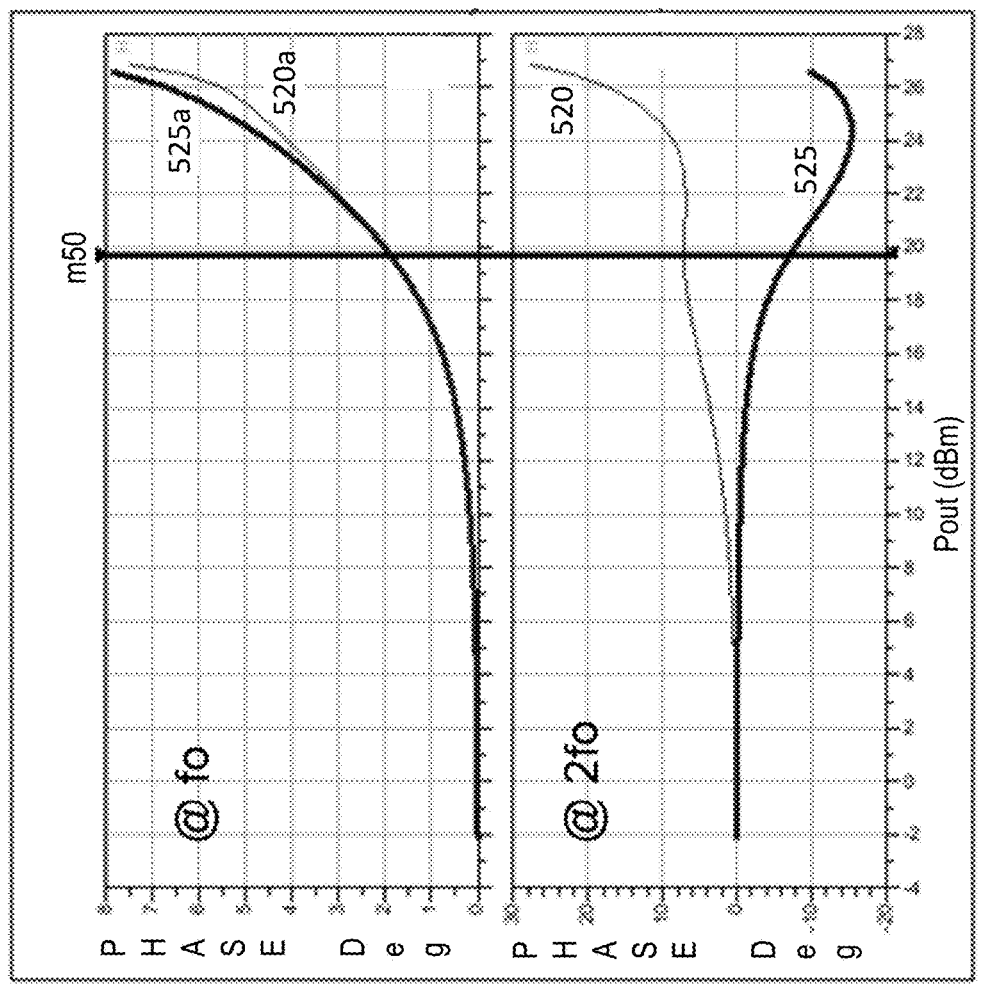
FIG. 5 shows graphs representing relative phase change (phase normalized to zero at low power) at the input of the amplifier as a function of output power at the output of the amplifier of FIG. 2, at the fundamental frequency and at the second harmonic of the fundamental frequency, contrasted to a case where the input harmonic termination of FIG. 2 is not used.

FIG. 5 shows graphs, (520, 525) and (520a, 525a), respectively representing phase change (i.e., relative phase change, which is the phase normalized to zero at low power) of the RF voltage at the input of the amplifier (105) as a function of output power at the output of the amplifier (105) of FIG. 2, at the operating frequency, $f_0$, and at the second harmonic of the operating frequency, $2f_0$, contrasted to a case where the input harmonic termination (225) of FIG. 2 is not used. Bold graphs (525, 525a) respectively show phase change at the input of the amplifier (105), at $2f_0$ and $f_0$, as a function of the output power with both input and output harmonic terminations (215, 225) present, while graphs (520, 520a) respectively show phase change at the input of the amplifier, at $2f_0$ and $f_0$, as a function of the output power without the input harmonic termination (225). Marker m50 is set at a nominal output power of about 20 dBm.

As can be seen in FIG. 5, at the operating frequency, $f_0$, phase change responsive to RF drive at the input of the amplifier (105) is not significantly affected by the presence of the input harmonic termination (225). However, at the second harmonic frequency, $2f_0$, phase change responsive to the RF drive at the input of the amplifier (105) is affected by the presence of the input harmonic termination (225). As discussed above with reference to FIG. 4B, the different pulling behavior of the phase of the impedance looking into the input of the amplifier (105), characterized by a corresponding slope in the region of $2f_0$, allows for such difference in phase change at the second harmonic frequency $2f_0$ as shown in graphs 520 and 525. In particular, as shown in graph (520), the phase change at $2f_0$ expands (i.e., positively increases) as a function of the increasing output power for the case where the input harmonic termination (225) is not present, whereas in the case where the input harmonic termination (225) is present, as represented by the graph (525), the phase change at $2f_0$ compresses (i.e. negatively increases) as a function of the increasing output power. Such different response can in turn allow for a reduction in AM-PM distortion as shown in the graphs of FIG. 6B, while maintaining a same AM-AM performance as shown in the graphs of FIG. 6A.

Figure 6B:
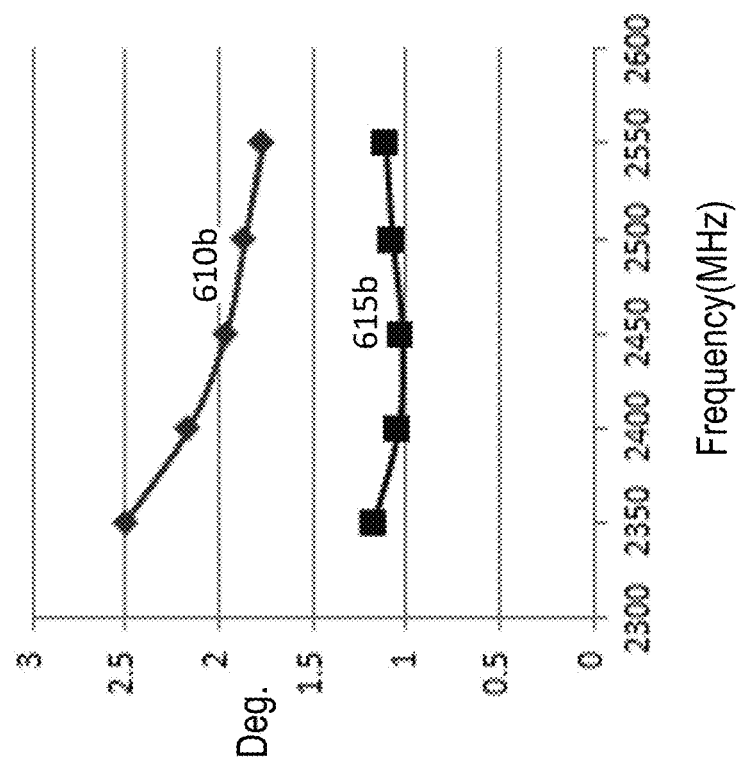
FIG. 6B shows graphs representing AM-PM distortion, as a function of frequency, at the output of the amplifier of FIG. 2, contrasted to a case where the input harmonic termination of FIG. 2 is not used.
Figure 6A:
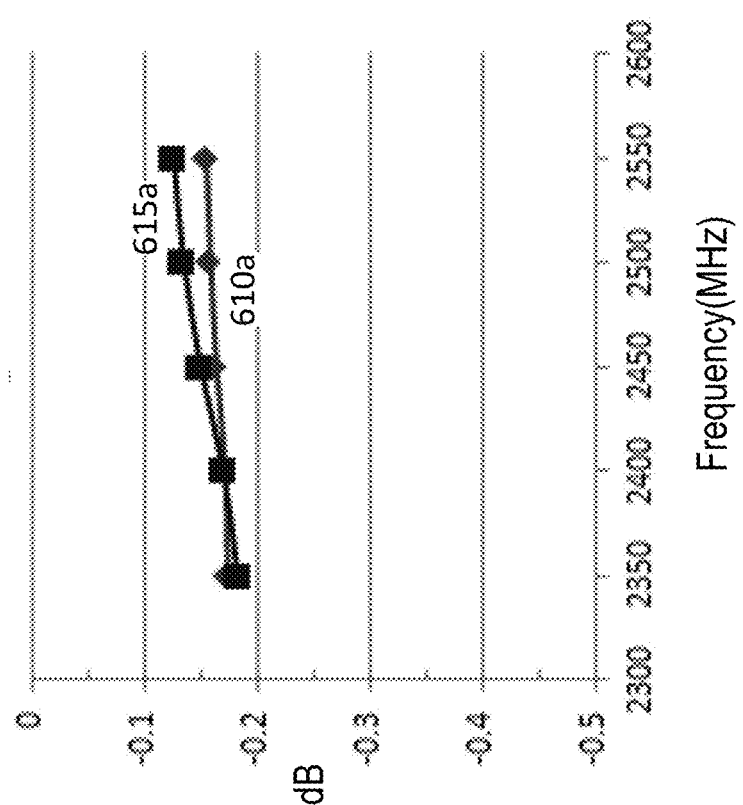
FIG. 6A shows graphs representing AM-AM distortion, as a function of frequency, at the output of the amplifier of FIG. 2, contrasted to a case where the input harmonic termination of FIG. 2 is not used.

FIG. 6A shows graphs (610a, 615a) representing AM-AM distortion (in dB) at the output of the amplifier of FIG. 2, as a function of frequency in a frequency range (e.g. frequency band) centered at the operating frequency, $f_0$. Graph (615a) represents a case depicted in FIG. 2 where both input and output harmonic terminations (225, 215) are present, while graph (610a) represents a case where the input harmonic termination (225) of FIG. 2 is not present. As can be seen in FIG. 6A, AM-AM performance is not significantly affected by the presence of the input harmonic termination (225) in a frequency band that spans from a low frequency of about 2.35 GHz to a high frequency of about 2.55 GHz (e.g., about 200 MHz bandwidth). As known to a person skilled in the art, the frequency band may be in correspondence of many different channels and/or modes, each using a portion of the frequency band. In this case, the operating frequency, $f_0$, can be considered as the center frequency of the band.

FIG. 6B shows graphs (610b, 615b) representing AM-PM distortion (in degrees) at the output of the amplifier of FIG. 2, as a function of frequency in a frequency range (e.g., frequency band) centered at the operating frequency, $f_0$. Graph (615b) represents a case depicted in FIG. 2 where both input and output harmonic terminations (225, 215) are present, while the graph (610b) represents a case where the input harmonic termination (225) of FIG. 2 is not present. As can be seen in FIG. 6B, AM-PM performance is significantly improved (e.g., flatter response, less distortion) by the presence of the input harmonic termination (225) in the entire frequency band that spans from a low frequency of about 2.35 GHz to a high frequency of about 2.55 GHz (e.g., about 200 MHz bandwidth).

Figure 7:
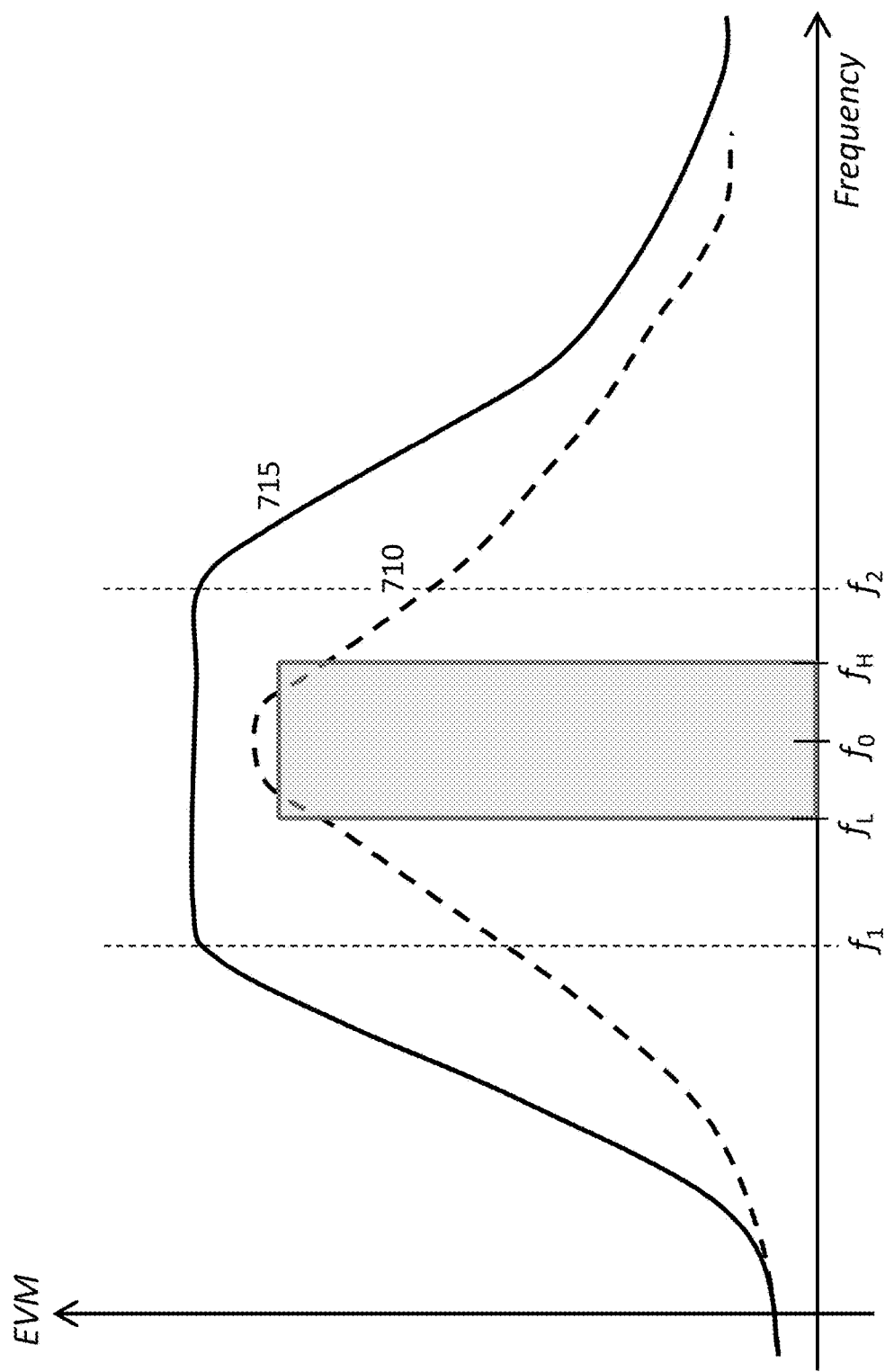
FIG. 7 shows graphs representing error vector magnitude (EVM), as a function of frequency, at the output of the amplifier of FIG. 2, contrasted to a case where the input harmonic termination of FIG. 2 is not used.

FIG. 7 shows graphs (710, 715) representing error vector magnitude (EVM), as a function of frequency, at the output of the amplifier of FIG. 2, for a case where both input and output harmonic terminations (225, 215) are used, as represented by the graph (715), and for a case where the input harmonic termination (225) is not used, represented by the graph (710). As can be seen in FIG. 7, presence of the input harmonic termination (225), as represented by the graph (715), provides for an improved EVM performance at the operating frequency, $f_0$, while broadening a frequency band of the EVM response (as measured by a substantially constant EVM). The frequency band of the EVM response in the case where both harmonic terminations (225, 215) are present, as represented by the graph (715), is the range defined by the low frequency $f_1$ and the high frequency $f_2$, within which range the EVM value remains substantially constant. Such range is substantially broader than the range defined by the low frequency value $f_L$ and the high frequency value $f_H$, which represents the EVM response for the case where the input harmonic termination (225) is not present (graph 710). It should be noted that such broadening of the EVM response as provided by the harmonic terminations (215, 225) of the present teachings, can allow support, without substantial EVM degradation, of broader frequency bands of operation of the input RF signal to the amplification stage (200) of FIG. 2 than possible with the prior art configuration depicted in FIG. 1A.

As noted above, the frequency band of operation of the input RF signal can impact tuning of the input and output harmonic terminations (225, 215). According to an exemplary embodiment of the present disclosure, a desired frequency band of operation can be selected, and resonant frequencies of the input and output harmonic terminations derived based on the selection. For example, considering the graph (715) of FIG. 7, a desired frequency band of operation may be defined by the low frequency value $f_1$ and the high frequency value $f_2$, within which, for example, the EVM value remains substantially constant (as shown in FIG. 7). According to an exemplary embodiment of the present disclosure, the input harmonic termination may be tuned at a frequency of $2f_1$ and the output harmonic termination may be tuned at a frequency of $2f_2$.

Figure 8B:
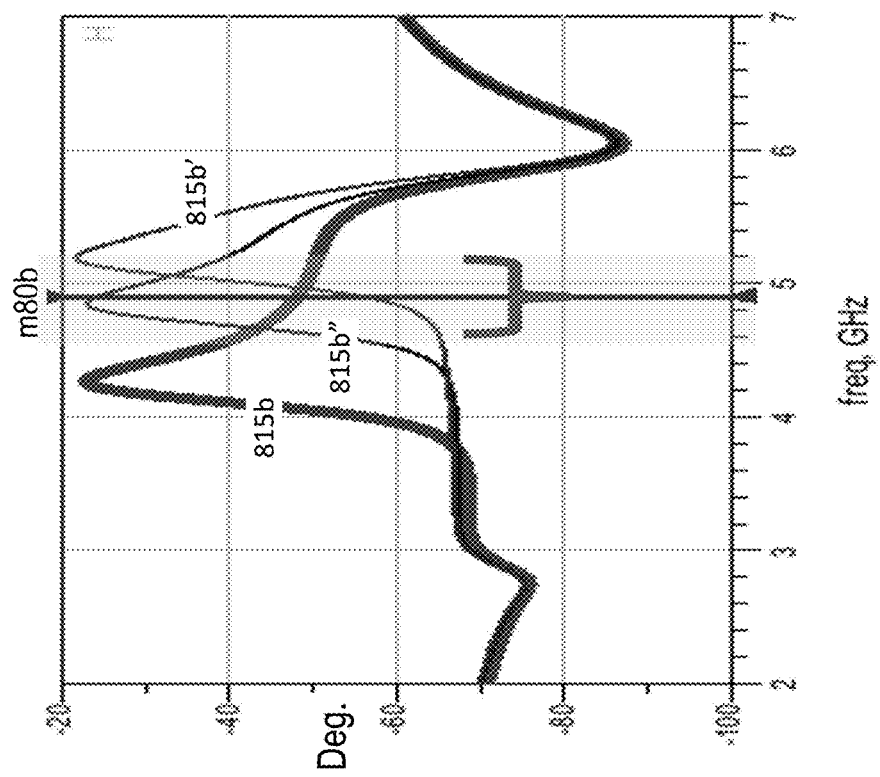
FIG. 8B shows graphs representing phase, as a function of frequency, of the impedance looking into the input of the amplifier of FIG. 2 for the three cases of different tuning frequencies of FIG. 8A.
Figure 8A:
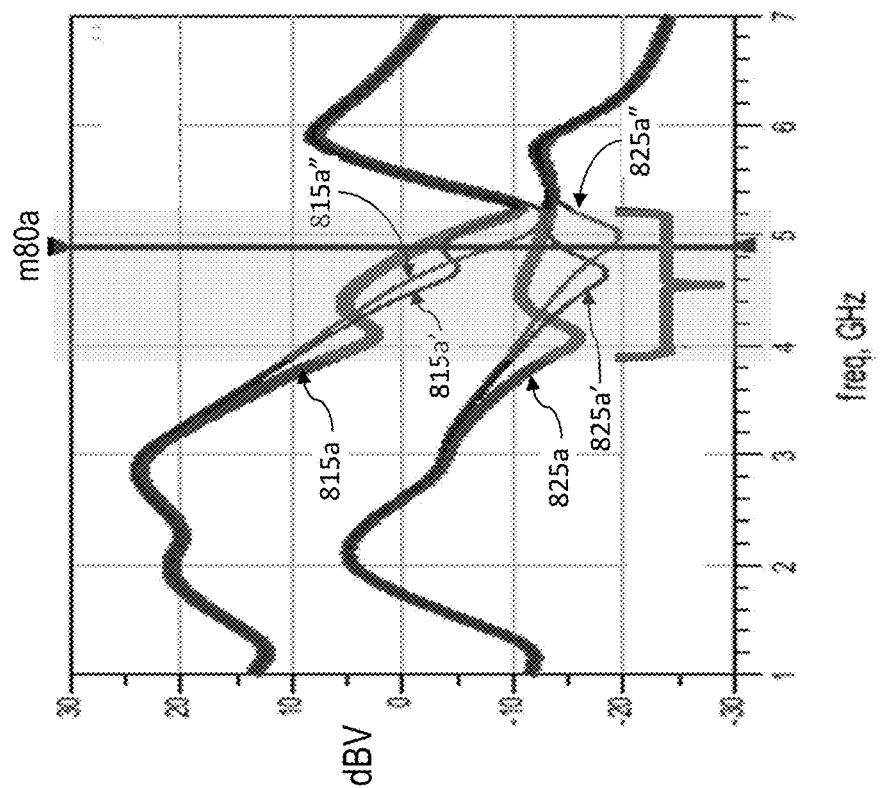
FIG. 8A shows graphs representing magnitude, as a function of frequency, of an RF signal at the input and the output of the amplifier of FIG. 2 for three cases of different tuning frequencies of the input harmonic termination while maintaining the output harmonic termination tuned at a same frequency.
Figures 8C, 8D:
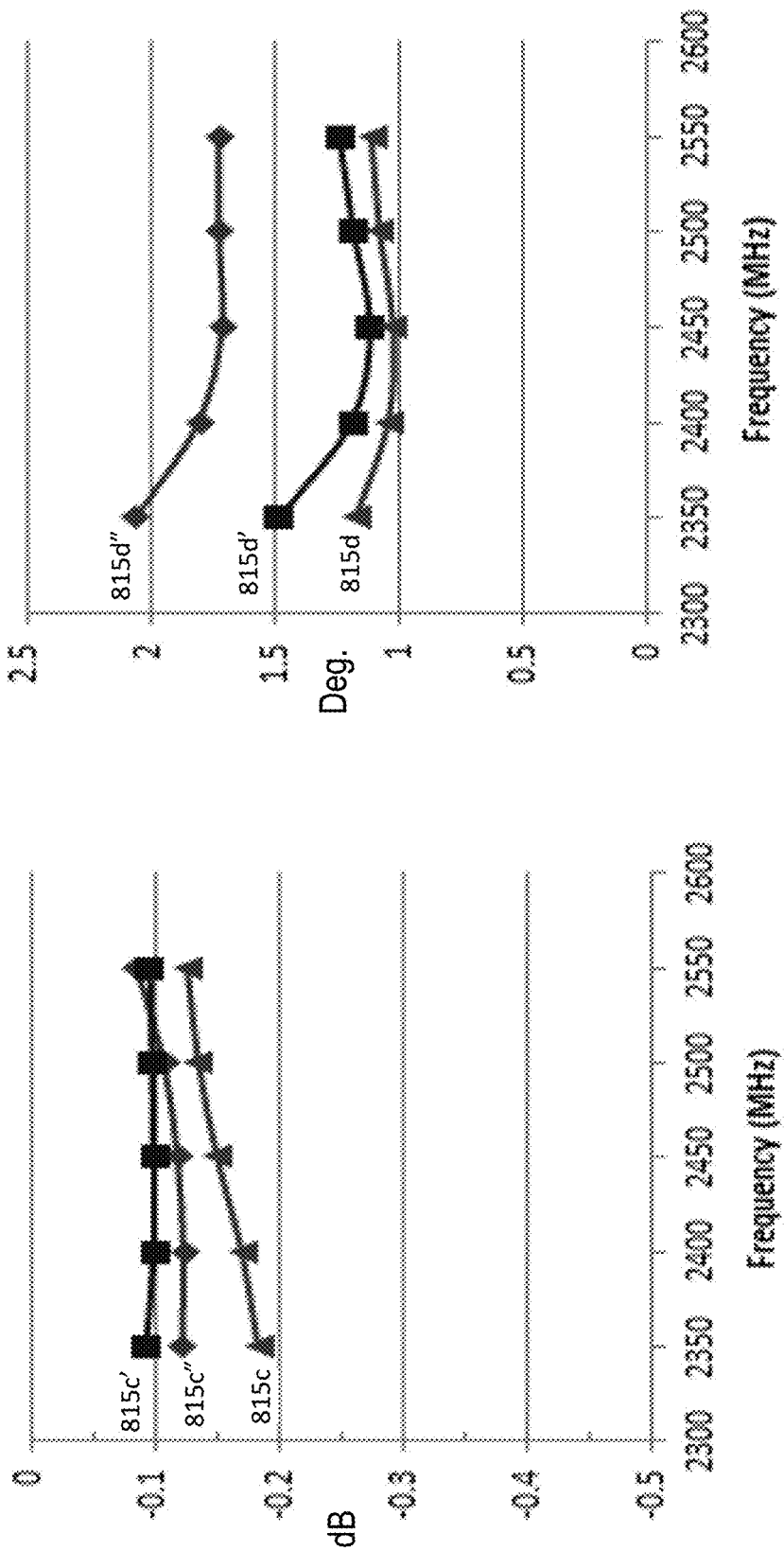
FIG. 8C shows graphs representing AM-AM distortion, as a function of frequency, at the output of the amplifier of FIG. 2 for the three cases of different tuning frequencies of FIG. 8A.
FIG. 8D shows graphs representing AM-PM distortion, as a function of frequency, at the output of the amplifier of FIG. 2 for the three cases of different tuning frequencies of FIG. 8A.

FIG. 8A shows graphs representing magnitude in dBV, as a function of frequency, of an RF signal at the input and the output of the amplifier (105) of FIG. 2 for three cases of different tuning frequencies (e.g. 4.1 GHz, 4.65 GHz, 5.00 GHz) of the input harmonic termination (225) while maintaining the output harmonic termination (215) tuned at a same frequency (e.g., 5.22 GHz). Graphs (815a, 815a', 815a") respectively show magnitude of the RF signal at the output of the amplifier (105) of FIG. 2, as a function of frequency, for tuning frequencies (4.1 GHz, 4.65 GHz, 5.00 GHz) of the input harmonic termination (225). Graphs (825a, 825a', 825a") respectively show magnitude of the RF signal at the input of the amplifier (105) of FIG. 2, as a function of frequency, for tuning frequencies (4.1 GHz, 4.65 GHz, 5.00 GHz) of the input harmonic termination (225). FIG. 8B shows graphs (815b, 815b', 815b") respectively representing phase, as a function of frequency, of the impedance looking into the input of the amplifier of FIG. 2 for the three cases of different tuning frequencies (4.1 GHz, 4.65 GHz, 5.00 GHz) of FIG. 8A. FIG. 8C shows graphs (815c, 815c', 815c") respectively representing AM-AM distortion, as a function of frequency, at the output of the amplifier of FIG. 2 for the three cases of different tuning frequencies (4.1 GHz, 4.90 GHz, 5.00 GHz) of FIG. 8A. FIG. 8D shows graphs (815d, 815d', 815d") respectively representing AM-PM distortion, as a function of frequency, at the output of the amplifier of FIG. 2 for the three cases of different tuning frequencies (4.1 GHz, 4.65 GHz, 5.00 GHz) of FIG. 8A. AM-AM distortion and AM-PM distortion being respectively calculated as gain and phase difference between a respective value at a high output power of 20 dBm and a respective value at a low output power. Markers m80a and m80b in FIG. 8A and FIG. 8B indicate position of the second harmonic frequency $2f_0$.

As can be seen in the graphs (815a, 815a', 815a") of FIG. 8A, as the tuning frequency of the input harmonic termination (225) is increased, increased attenuation of the second harmonic component at the input of the amplifier, as reflected by the intersection of such graphs with the marker m80a, is obtained. On the other hand, as indicated by the graphs (815b, 815b', 815b") of FIG. 8B, with the same increase of the tuning frequency of the input harmonic termination (225), a slope of the phase with respect to frequency, of the impedance looking into the input of the amplifier (105), becomes extremely steep and loses a desired linearity crossing the second harmonic frequency $2f_0$ (see discussion above related to FIG. 4B). As both, the attenuation of the second harmonic component at the input of the amplifier, and the phase linearity, given by a corresponding slope, of the impedance looking into the input of the amplifier around the second harmonic frequency $2f_0$, can affect phase response at the input of the amplifier (105) with respect to RF drive, a trade-off of the location of the tuning frequency of the input harmonic termination should be made.

Based on the above, and considering AM-AM and AM-PM as performance metrics of the amplification stage (200) shown in FIG. 2, the graphs of FIG. 8C (AM-AM) and FIG. 8D (AM-PM) indicate that the highest tuning frequency (e.g. 5.00 GHz, graph 815d" of FIG. 8D) of the input harmonic termination (225) results in worse AM-PM performance. The lowest and middle tuning frequencies (e.g. 4.1 GHz, 4.65 GHz) result in a trade-off between AM-AM and AM-PM performance, where increased AM-AM performance is obtained by the middle value of the tuning frequency (e.g. 4.65 GHz, graph 815c' of FIG. 8C, as higher second harmonic attenuation is provided per FIG. 8A), and increased AM-PM performance is obtained by the lowest value of the tuning frequency (e.g. 4.1 GHz, graph 815d of FIG. 8D, as a more linear slope of the input impedance phase is provided across the second harmonic frequency per FIG. 8B).

Figure 9:
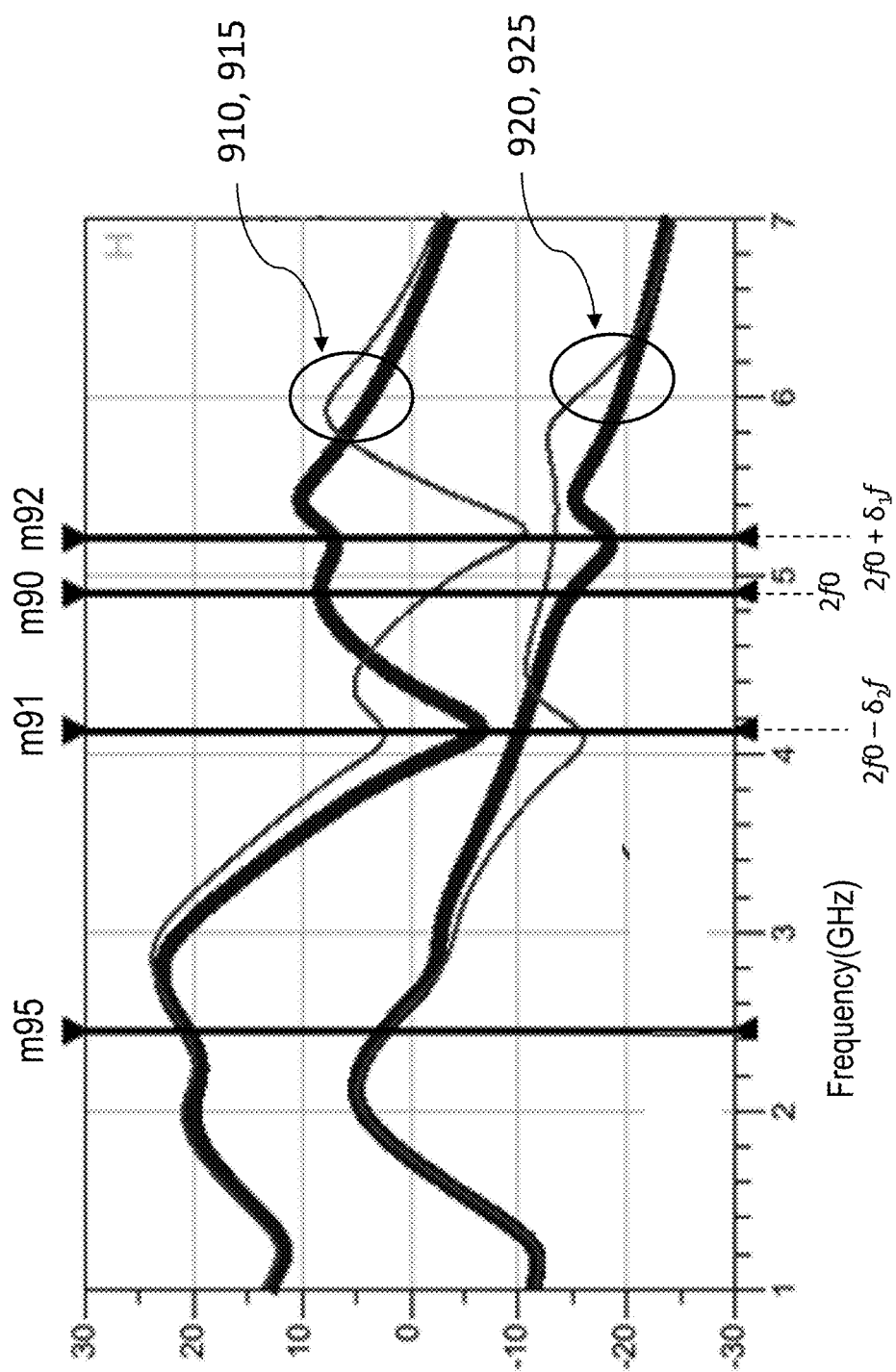
FIG. 9 shows graphs representing magnitude, as a function of frequency, of an RF signal at the input and the output of an amplifier of an amplification stage similar to one depicted in FIG. 2, with the difference that the input harmonic termination is tuned at a frequency that is greater than twice a fundamental frequency of an input RF signal to the amplifier, and the output harmonic termination is tuned at a frequency that is smaller than twice the fundamental frequency of the input RF signal to the amplifier.

FIG. 9 shows graphs representing magnitude, as a function of frequency, of an RF signal at the input and the output of an amplifier (e.g. 105 of FIG. 2) of an amplification stage similar to one depicted in FIG. 2, with the difference that the input harmonic termination (225) is tuned at a frequency, $2f0+\delta_1 f$, that is greater than twice the operating frequency, f0, of the input RF signal, $RF_{IN}$, to the amplifier (105), and the output harmonic termination (215) is tuned at a frequency, $2f0-\delta_2 f$, that is smaller than twice the operating frequency, f0. Such "swapped" tuning of the harmonic terminations (215, 225), represented by the bold graphs, is contrasted in FIG. 9 to the tuning described above with reference to FIG. 2 (non-bold graphs). Markers m95, m90, m91 and m92 of FIG. 9 respectively indicate positions of the operating frequency $f_0$; of the second harmonic frequency, $2f_0$; of the output harmonic termination (215) resonant frequency $2f_0 - \delta_2 f$ (e.g., 4.13 GHz) of the swapped tuning configuration; and of the input harmonic termination (225) resonant frequency $2f_0+\delta_1 f$ (e.g., 5.21 GHz) of the swapped tuning configuration. Impact on the AM-AM and AM-PM performance of such "swapped" tuning configuration as compared to the configuration of FIG. 2 is shown in the graphs of FIG. 10A and FIG. 10B respectively.

As can be seen in FIG. 9, when compared to the configuration of FIG. 2 described above, the swapped tuning configuration, where the input harmonic termination (225) is tuned at a frequency above the second harmonic frequency $2f_0$ and the output harmonic termination (215) is tuned at a frequency below the second harmonic frequency $2f_0$, provides a substantially lesser attenuation of the second harmonic component (intersection of graphs 910, 915 with marker m90) at the output of the amplifier (105). As a result, and as can be seen in the graphs of FIG. 10A, AM-AM performance is degraded from about −0.15 dB (intersection of m100a and graph 1010a) to about −0.24 dB (intersection of m100a and graph 1015a) at an output power (Pout) of 20 dBm, and much more severely at higher output powers.

Figure 10B:
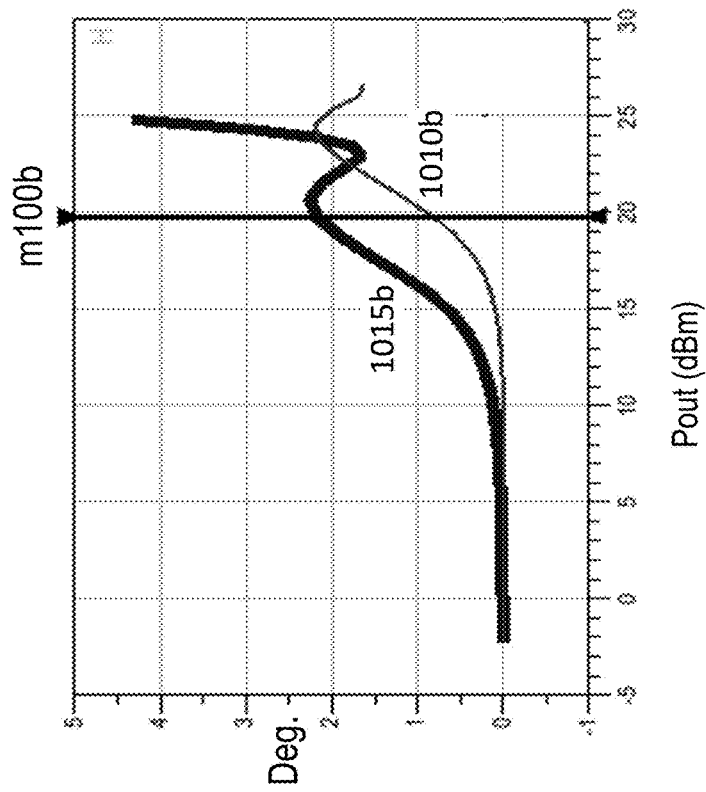
FIG. 10B shows graphs representing AM-PM distortion, as a function of frequency, at the output of the amplifier of the amplification stage described with respect to FIG. 9.
Figure 10A:
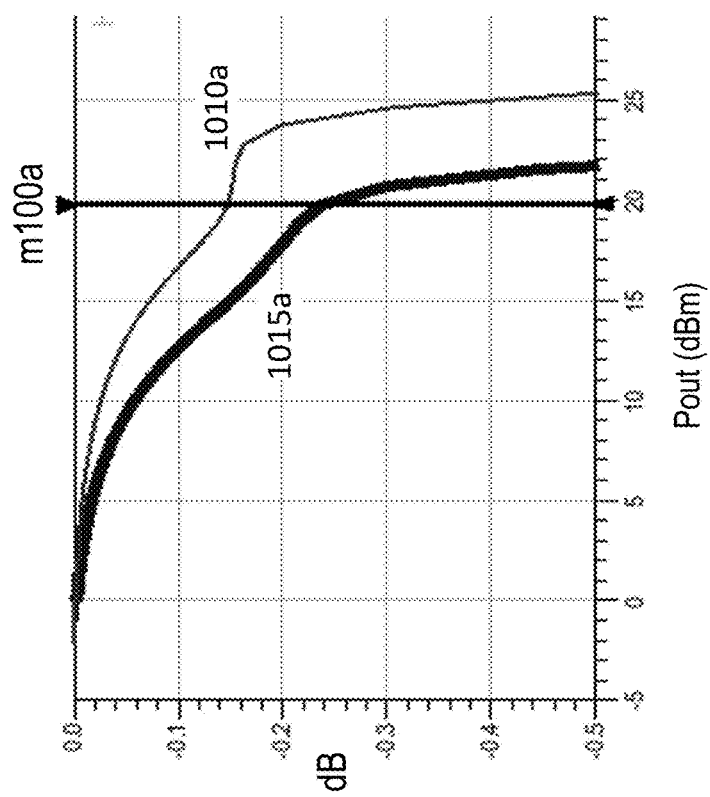
FIG. 10A shows graphs representing AM-AM distortion, as a function of frequency, at the output of the amplifier of the amplification stage described with respect to FIG. 9.

With reference to FIG. 10B, AM-PM performance is degraded from about 0.8 degrees (intersection of m100b and graph 1010b) to about 2.3 degrees (intersection of m100b and graph 1015b) at an output power (Pout) of 20 dBm when comparing the swapped tuning configuration with the configuration of FIG. 2 described above.

Based on the above, a person skilled in the art would realize that an asymmetrical frequency tuning, with respect to the second harmonic frequency of the operating frequency, of the input and output harmonic terminations (225, 215) of FIG. 2, may be viable when considering AM-AM and AM-PM metrics in an amplification stage provided that: i) the input harmonic termination (225) is tuned at a frequency below the output harmonic termination (215), ii) the input harmonic termination is tuned at a frequency that is farther away from the second harmonic frequency when compared to the tuning frequency of the output harmonic termination (215), and iii) the input and output harmonic terminations are tuned at frequencies different from the second harmonic frequency.

As noted above, the amplification stage (200) of FIG. 2 may be part of a larger amplification chain comprising one or more cascaded and/or parallel amplification stages. Such amplification chains are well known in the art, used, for example, in frontend circuits of communication systems. FIG. 11 shows an exemplary configuration (1100) of such amplification chain comprising two cascaded amplification stages (1110, 1120), such as, for example, a driver stage (e.g., 1110) and a final stage (e.g., 1120), where the final stage (1120) is further configured with two parallel amplification stages (1120a, 1120b). According to some non-limiting exemplary embodiments, the two parallel amplification stages may each have a different amplification gain. As can be seen in FIG. 11, an input harmonic termination (225) according to the present teachings is provided at the input of the amplifier (105) of the amplification stage (1120a). The combination of the amplification stage (1120a) with the output harmonic termination (215) common to both amplification stages (1120a, 1120b) impacts the AM-AM and AM-PM performance of the amplification chain (1100) in a favorable manner per the above description with respect to FIG. 2. A person skilled in the art would realize that the amplification stage (1120a) in combination with the output harmonic termination (215) provides an RF signal path equivalent to one provided by the amplification stage (200) of FIG. 2.

Applications that may include the novel apparatus and systems of various embodiments include electronic circuitry used in high-speed computers, communication and signal processing circuitry, modems, single or multi-processor modules, single or multiple embedded processors, data switches, and application-specific modules, including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., mp3 players), vehicles, medical devices (e.g., heart monitor, blood pressure monitor, etc.) and others. Some embodiments may include a number of methods.

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments according to the present disclosure have been described. It is to be understood that various modifications may be made without departing from the spirit and scope of such embodiments. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the disclosure, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A radio frequency (RF) amplification circuit comprising:
    an amplifier configured to amplify an RF signal having an operating frequency $f_0$;
    an input harmonic termination coupled to an input of the amplifier; and
    an output harmonic termination coupled to an output of the amplifier,
    wherein the input harmonic termination has a resonant frequency $f_{IN}$ that is near to, but smaller than, the second harmonic frequency $2f_0$ of the operating frequency, and
    wherein the output harmonic termination has a resonant frequency $f_{OUT}$ that is near to, but greater than, the second harmonic $2f_0$ frequency of the operating frequency.

2. The radio frequency (RF) amplification circuit of claim 1,
    wherein the resonant frequency of the input harmonic termination, $f_{IN}$, and the resonant frequency of the output harmonic termination, $f_{OUT}$, are bound by the following relationships:

$$f_{IN}=2f_0-\delta_1 f;$$

$$f_{OUT}=2f_0+\delta_2 f; \text{ and}$$

$$\delta_1 f > \delta_2 f,$$

wherein $\delta_1 f$ and $\delta_2 f$ represent a distance, in frequency, between a respective one of the resonant frequency of the input harmonic termination and of the output harmonic termination, and the second harmonic frequency $2f_0$ of the operating frequency $f_0$.

3. The radio frequency (RF) amplification circuit of claim 2, wherein:
    a frequency value of $\delta_1 f$ is in a range of 10% to 20% of $2f_0$, and
    a frequency value of $\delta_2 f$ is in a range of 5% to 10% of $2f_0$.

4. The radio frequency (RF) amplification circuit of claim 2, wherein:
    a frequency value of $\delta_1 f$ is in a range of 15% to 18% of $2f_0$, and
    a frequency value of $\delta_2 f$ is in a range of 5% to 8% of $2f_0$.

5. The radio frequency (RF) amplification circuit of claim 1, wherein each of the input harmonic termination and the output harmonic termination comprises reactive elements only.

6. The radio frequency (RF) amplification circuit of claim 1, wherein at least one of the input harmonic termination and the output harmonic termination comprises a capacitor in series connection with an inductor.

7. The radio frequency (RF) amplification circuit of claim 1, wherein the input and output harmonic terminations are configured to reduce AM-AM and AM-PM distortion at the output of the amplifier for a lesser suppression of a second harmonic component at the output of the amplifier.

8. The radio frequency (RF) amplification circuit of claim 1, wherein the input and output harmonic terminations are configured to broaden a linear slope of a phase of an impedance looking into the input of the amplifier across a frequency region comprising the second harmonic frequency $2f_0$, so that in the frequency region of the linear slope, the phase of the impedance looking into the input of the amplifier decreases linearly with respect to an increasing frequency.

9. The radio frequency (RF) amplification circuit of claim 1, wherein the amplifier is a CMOS amplifier comprising a stack of plurality of FET transistors arranged in a cascode configuration.

10. The radio frequency (RF) amplification circuit of claim 9, wherein the FET transistors are fabricated using one of: a) silicon-on-insulator (SOI) technology, and b) silicon-on-sapphire technology (SOS).

11. An electronic module comprising the radio frequency (RF) amplification circuit of claim 1.

12. A radio frequency (RF) circuit, comprising:
the RF amplification circuit of claim 1;
a second RF amplification circuit comprising an amplifier, the second RF amplification circuit connected in parallel with the RF amplification circuit of claim 1.

13. A method for improving AM-AM and AM-PM performance of an RF amplifier, the method comprising:
providing an amplifier configured to amplify an RF signal having an operating frequency $f_0$;
coupling an input harmonic termination to an input of the amplifier;
coupling an output harmonic termination to an output of the amplifier; and
based on the coupling, improving AM-AM and AM-PM performance of the RF amplifier,
wherein the input harmonic termination has a resonant frequency $f_{IN}$ that is near to, but smaller than, the second harmonic frequency $2f_0$ of the operating frequency, and
wherein the output harmonic termination has a resonant frequency $f_{OUT}$ that is near to, but greater than, the second harmonic frequency $2f_0$ of the operating frequency.

14. The method according to claim 13,
wherein the resonant frequency of the input harmonic termination, $f_{IN}$, and the resonant frequency of the output harmonic termination, $f_{OUT}$, are bound by the following relationships:

$$f_{IN}=2f_0-\delta_1 f;$$

$$f_{OUT}=2f_0-\delta_2 f; \text{ and}$$

$$\delta_1 f > \delta_2 f,$$

wherein $\delta_1 f$ and $\delta_2 f$ represent a distance, in frequency, between a respective one of the resonant frequency of the input harmonic termination and of the output harmonic termination, and the second harmonic frequency $2f_0$ of the operating frequency $f_0$.

15. The method according to claim 14, wherein:
a frequency value of $\delta_1 f$ is in a range of 10% to 20% of $2f_0$, and
a frequency value of $\delta_2 f$ is in a range of 5% to 10% of $2f_0$.

16. The method according claim 14, wherein:
a frequency value of $\delta_1 f$ is in a range of 15% to 18% of $2f_0$, and
a frequency value of $\delta_2 f$ is in a range of 5% to 8% of $2f_0$.

17. The method according to claim 13, wherein the improving AM-AM and AM-PM performance of the RF amplifier comprises a lesser suppression of a second harmonic component at the output of the amplifier.

* * * * *